United States Patent
Ruile et al.

(10) Patent No.: US 9,497,551 B2
(45) Date of Patent: Nov. 15, 2016

(54) ELECTROACOUSTIC TRANSDUCER

(71) Applicant: EPCOS AG, Munich (DE)

(72) Inventors: Werner Ruile, Munich (DE); Philipp Michael Jäger, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 14/650,230

(22) PCT Filed: Oct. 14, 2013

(86) PCT No.: PCT/EP2013/071425
§ 371 (c)(1),
(2) Date: Jun. 5, 2015

(87) PCT Pub. No.: WO2014/086524
PCT Pub. Date: Jun. 12, 2014

(65) Prior Publication Data
US 2015/0312681 A1    Oct. 29, 2015

(30) Foreign Application Priority Data

Dec. 6, 2012 (DE) .................. 10 2012 111 889

(51) Int. Cl.
*H04R 17/00* (2006.01)
*B06B 1/06* (2006.01)
(Continued)

(52) U.S. Cl.
CPC ............... *H04R 17/00* (2013.01); *B06B 1/06* (2013.01); *H01L 41/0906* (2013.01);
(Continued)

(58) Field of Classification Search
CPC .......................... H04R 17/02; H04R 2217/00–2217/03; H04R 19/00;
(Continued)

(56) References Cited

U.S. PATENT DOCUMENTS

| 2,405,472 A | * | 8/1946 | Tuttle | H04R 7/04 381/190 |
| 3,423,543 A | * | 1/1969 | Kompanek | H04R 17/00 381/190 |

(Continued)

FOREIGN PATENT DOCUMENTS

| DE | 112010003083 T5 | 6/2012 |
| EP | 0685985 A2 | 12/1995 |

(Continued)

OTHER PUBLICATIONS

"An American National Standard—IEEE Standard in Piezoelectricity," Standards Committee of the IEEE Ultrasonics, Ferroelectrics, and Frequency Control Society, ASI/IEEE Std 176-1987, Date of Current Version: Aug. 6, 2002, 74 pages.

(Continued)

*Primary Examiner* — Suhan Ni
(74) *Attorney, Agent, or Firm* — Slater Matsil, LLP

(57) ABSTRACT

An electroacoustic transducer has a piezoelectric layer, which is structured in such a way that, in the case of an alternating electric field applied in one spatial direction, an oscillation mode with oscillations in three spatial directions is excited.

20 Claims, 10 Drawing Sheets

(51) Int. Cl.
*H01L 41/09* (2006.01)
*H01L 41/18* (2006.01)
*H03H 9/02* (2006.01)
*H01L 41/047* (2006.01)
*H03H 9/24* (2006.01)

(52) U.S. Cl.
CPC ....... *H01L 41/0986* (2013.01); *H01L 41/0993* (2013.01); *H01L 41/183* (2013.01); *H03H 9/02228* (2013.01); *H01L 41/047* (2013.01); *H03H 2009/241* (2013.01)

(58) Field of Classification Search
CPC .................. H04R 19/01; H04R 19/013; H04R 19/016; H04R 7/04
USPC .................................. 381/173, 190, 191, 431
See application file for complete search history.

(56) References Cited

U.S. PATENT DOCUMENTS

| | | | |
|---|---|---|---|
| 4,843,275 A * | 6/1989 | Radice | H04R 17/025 381/190 |
| 5,684,883 A | 11/1997 | Chen | |
| 5,684,884 A * | 11/1997 | Nakaya | H04R 17/00 381/190 |
| 7,109,642 B2 * | 9/2006 | Scott | B06B 1/064 310/358 |
| 8,399,059 B2 | 3/2013 | Steinfeldt et al. | |
| 8,819,904 B2 | 9/2014 | Gorisse et al. | |
| 2007/0252485 A1 | 11/2007 | Kawakubo et al. | |
| 2009/0010459 A1 * | 1/2009 | Garbini | A61B 8/12 381/190 |
| 2012/0007475 A1 | 1/2012 | Ruile et al. | |
| 2012/0187507 A1 | 7/2012 | Bontemps et al. | |
| 2014/0018126 A1 | 1/2014 | Asai et al. | |

FOREIGN PATENT DOCUMENTS

| | | |
|---|---|---|
| EP | 2487793 A1 | 8/2012 |
| JP | 0723500 A | 1/1995 |
| JP | 07327297 A | 12/1995 |
| JP | 09243656 A | 9/1997 |
| JP | 2004088056 A | 3/2004 |
| JP | 2010088877 A | 4/2010 |
| JP | 2011018959 A | 1/2011 |
| JP | 2013500607 A | 1/2013 |
| WO | 2011016994 A1 | 2/2011 |
| WO | 2011131844 A1 | 10/2011 |
| WO | 2012064283 A1 | 5/2012 |
| WO | 2012137574 A1 | 10/2012 |

OTHER PUBLICATIONS

Akiyama, M., et al., "Enhancement of Piezoelectric Response in Scandium Aluminum Nitride Alloy Thin Films Prepared by Dual Reactive Cosputtering," Advanced Materials, vol. 21, Issue 5, Feb. 2009, pp. 593-596.

Auld, B., "Acoustic Fields and Waves in Solids," vol. 2, Hardcover Publication dated Feb. 1, 1990 (Original Publication dated 1973), pp. 347-353 and pp. 357-361.

Brainerd, J.G., et al., "Standards on Piezoelectric Crystals, 1949," Proceedings of the I.R.E., vol. 37, Issue 12, Dec. 1949, pp. 1378-1395.

Khine, L., et al., "Piezoelectric AlN MEMS Resonators with High Coupling Coefficient," IEEE Transducers, 16th International Solid-State Sensors, Actuators and Microsystems Conference, Jun. 5-9, 2011, pp. 526-529.

Kuo, N., et al., "1 GHz Phononic Band Gap Structure in Air/Aluminum Nitride for Symmetric Lamb Waves," IEEE MEMS, 24th International Conference on Micro Electro Mechanical Systems, Jan. 23-27, 2011, pp. 740-743.

Kuo, N., et al., "Demonstration of Inverse Acoustic Band Gap Structures in AlN and Integration with Piezoelectric Contour Mode Transducers," IEEE Transducers, Jun. 21-25, 2009, pp. 2334-2337.

Kuo, N., et al., "Demonstration of Inverse Acoustic Band Gap Structures in AlN and Integration with Piezoelectric Contour Mode Wideband Transducers," IEEE International Joint with the 22nd European Frequency and Time Forum, Frequency Control Symposium, Apr. 20-24, 2009, pp. 10-13.

Kuo, N., et al., "Microscale Inverse Acoustic Band Gap Structure in Aluminum Nitride," Applied Physics Letters, vol. 95, No. 9, Sep. 2, 2009, pp. 093501-1-093501-3.

Kuo, N., et al., "X-Shaped Phononic Crystals for Side Lobe Reduction in Ultra High Frequency Slanted Finger Inter-Digitated Aluminum Nitride Lamb Wave Transducers," PS-11, Carnegie Mellon University, Oct. 2012, 4 pages.

Nye, J.F., "Physical Properties of Crystals—Their Representation by Tensors and Matrices," Oxford Science Publications, Jul. 11, 1985, pp. 276-301.

Zuo, C., et al., "Cross-Sectional Dilation Mode Resonator with Very High Electromechanical Coupling up to 10% using AlN," IEEE International Frequency Control Symposium (FCS), May 21-24, 2012, pp. 173.

* cited by examiner

ELECTROACOUSTIC TRANSDUCER

This patent application is a national phase filing under section 371 of PCT/EP2013/071425, filed Oct. 14, 2013, which claims the priority of German patent application 10 2012 111 889.2, filed Dec. 6, 2012, each of which is incorporated herein by reference in its entirety.

TECHNICAL FIELD

The present invention relates to an electroacoustic transducer.

BACKGROUND

An increase in the coupling factor of an electroacoustic transducer is tantamount to the reduction of the losses during the conversion between electrical energy and mechanical energy in the transducer. A high coupling factor enables a large bandwidth of the transducer.

In "Acoustic waves in fields and solids" by B. Auld, volume II, John Wiley & Sons, New York, London, Sydney, Toronto, 1973, pages 347 et seq. and 357 et seq., a so-called "thin plate resonator" is described. In that case, an oscillation of a plate in two spatial directions is investigated and the corresponding modes are described.

Furthermore, the paper "Cross-sectional Dilation Mode Resonator with Very High Electromechanical Coupling up to 10% using AlN" by C. Zuo et al., which was presented at the Frequency Control Symposium 2012, describes how the coupling factor of an AlN layer can be increased by a two-dimensional structuring. The AlN layer is structured in such a way that a two-dimensional oscillation mode is excited, wherein an alternating electric field is applied in the thickness direction of the AlN layer and additionally brings about an excitation in a width direction besides the excitation in the thickness direction. As a result, the electromechanical coupling factor is increased in comparison with a pure thickness oscillation that occurs in the case of an FBAR, for example.

SUMMARY

The present invention relates to an electroacoustic transducer. The electroacoustic transducer can be a transducer that operates with surface acoustic waves (surface acoustic wave=SAW) or a transducer that operates with bulk acoustic waves (bulk acoustic wave=BAW).

Embodiments of the present invention specify a further possibility for increasing the coupling factor in an electroacoustic transducer.

An electroacoustic transducer having a piezoelectric layer is proposed, which piezoelectric layer is structured in such a way that, in the case of an alternating electric field applied in one spatial direction, an oscillation mode with oscillations in three spatial directions is excited.

Compared with oscillation modes with oscillations in only one or in two spatial directions, the coupling factor is increased further in the case of an oscillation mode with oscillations in three spatial directions. In this case, more components of the piezo-tensor can be utilized and contribute to the coupling factor.

In contrast to the one-dimensional oscillation mode, in which only one element of the piezo-tensor is utilized, namely the longitudinal component or the shear component, at least three and up to six elements of the piezo-tensor are utilized in the case of an oscillation mode with oscillations in three spatial directions.

Of this maximum of six elements, respectively three are responsible for longitudinal oscillations and three for shear oscillations. An increase in the coupling factor is achieved as a result of this utilization of as many elements of the piezo-tensor as possible. In this case, it is unimportant whether only longitudinal or shear excitations are involved, since any arbitrary combination thereof also fulfills the purpose of increasing the coupling factor.

An electroacoustic transducer whose coupling factor is increased in this way can be used, for example, in individual filters, duplexers, resonators, sensors, resonator filters, modules, band-stop filters or notch filters.

The alternating electric field applied in one spatial direction is usually an alternating electric field that is present between two planar electrodes. In this case, the piezoelectric layer can be arranged between the two electrodes. The piezoelectric layer is structured here in such a way that a simple bulk acoustic wave for which the piezoelectric layer oscillates only in one spatial direction is not formed, rather an oscillation mode is excited for which the piezoelectric layer oscillates in three spatial directions.

The piezoelectric layer can comprise, for example, one of the following materials: zinc oxide (ZnO), aluminum nitride (AlN), lithium tantalate, lithium niobate, lead zirconate titanate (PZT) and PZT replacement materials. Furthermore, the piezoelectric layer can comprise additives and dopings to the piezoelectric materials, for example, AlN can be doped with Sc.

The piezoelectric layer can comprise a planar layer that is structured with holes and/or slots.

It has surprisingly been found here that the coupling factor can be increased as a result of the structuring of a planar layer with holes and/or slots. The structuring with holes and/or slots gives rise to structures in the piezoelectric layer which enable the excitation of an oscillation mode with oscillations in three spatial directions.

The transducer can have a region in which the extent of the piezoelectric layer in the direction in which the speed of sound in the piezoelectric layer is the highest is at least of just the same magnitude as the extent of the piezoelectric layer in the other spatial directions. The oscillation mode with oscillations in three spatial directions can be excited particularly well in this region. The larger this region is made, the greater the extent to which the coupling factor of the electroacoustic transducer is increased, since the proportion of the oscillation mode with oscillations in three spatial directions is increased in this case.

In an edge region of the piezoelectric layer, the extent of the piezoelectric layer in the direction of the highest speed of sound can be less than the extent of the piezoelectric layer in the other spatial directions. As a result, it is possible to prevent disturbance modes from arising in the edge regions, which disturbance modes might otherwise arise on account of the finite dimensioning of the piezoelectric layer.

The extent of the piezoelectric layer in the direction in which the speed of sound in the piezoelectric layer is the highest can be chosen such that the resonator is operated in the fundamental mode. For this purpose, the thickness of the piezoelectric layer can be chosen to be between 30 and 70% of the acoustic wavelength of the resonant frequency of the transducer. Preferably, the thickness is in a range of between 40 and 60% of the acoustic wavelength of the resonant frequency of the transducer. Furthermore, it is conceivable for the resonator to be operated in a harmonic mode, too.

The direction in which the speed of sound is the highest is determined by the crystal structure of the piezoelectric layer. The direction in which the speed of sound is the highest can be, for example, a vertical direction aligned perpendicularly to the planar electrodes. However, the direction in which the speed of sound is the highest can also form any other angle with respect to the electrodes.

The electroacoustic transducer can comprise a first and a second electrode, wherein a top side of the piezoelectric layer is connected to the first electrode and an underside of the piezoelectric layer is connected to the second electrode. The first electrode is also designated as the top electrode. The second electrode is also designated as the bottom electrode.

The top side and the underside here can in each case bear directly against the respective electrode. Furthermore, the piezoelectric layer has a side surface, which can be perpendicular to the top side and to the underside. The side surface can also form some other angle with the top side and the underside. The side surface can be free of the electrodes.

The first and second electrodes can comprise, for example, one of the following metals and alloys thereof: Al, Cu, Au, Ag, Pt, Pd, W, Ni, Mo, Nb, V, Ti, Cr, Mg, Fe, Ir, Ru, Rh, Os, Bi, Hf. Furthermore, the first and second electrodes can comprise the—not explicitly listed here—secondary group metals and lanthanides and refractory carbides, nitrides and borides of the former secondary group metals, in particular of groups 4, 5, 6 (old designation IVB, VB, VIB), that is to say Ti, Zr, Hf (group 4), V, Nb, Ta (group 5), Cr, Mo, W (group 6), and any mixed systems thereof. The electrodes can consist of a single conductive material or can be constructed from a stack of a plurality of layers, wherein at least one of said layers comprises a conductive material.

The piezoelectric layer can comprise a plurality of blocks comprising a piezoelectric material, wherein the extent of the blocks in the direction in which the speed of sound in the piezoelectric layer is the highest is at least of just the same magnitude as the extent of the respective block in the other spatial directions. The blocks can be insulated from one another. In particular, a respective interspace can be arranged between two adjacent blocks, such that the adjacent blocks do not touch one another. As discussed in even greater detail below, a connection structure, a vacuum, air or any other material, preferably a material having an abnormal thermomechanical behavior, can be arranged in the interspace.

Furthermore, the piezoelectric layer can contain further blocks which likewise comprise a piezoelectric material and which do not fulfill this design specification. All that is crucial is that a significant portion, for example, at least 70%, of all the blocks of the piezoelectric layer fulfill the design specification. The blocks in which the extent in the direction of the highest speed of sound is at least of the same magnitude as the extent in the other spatial directions enable the excitation of an oscillation mode with oscillations in all three spatial directions.

The electrode can comprise a first and a second electrode structure, wherein each of the blocks is connected either to the first or to the second electrode structure. Accordingly, different potentials can be applied to adjacent blocks, of which one is connected to the first electrode structure and the other is connected to the second electrode structure, such that the blocks are coupled in opposite directions to one another. Coupling different regions of the piezoelectric layer in opposite directions makes it possible to suppress nonlinearities of the transducer.

Accordingly, the blocks and the electrode structure can be arranged in such a way that two adjacent blocks are connected to different electrode structures.

Both the first and the second electrode can comprise a first and a second electrode structure.

Alternatively, the transducer could be configured in such a way that one of the first and second electrodes comprises a first and a second electrode structure and the respective other electrode comprises a single continuous electrode structure.

A connection structure can be arranged between two blocks, said connection structure connecting the two blocks to one another in a lateral direction. The lateral direction can be perpendicular to a surface normal of the electrodes. The connection structure can comprise a dielectric material.

The connection structure can form a web that extends from a first block in the lateral direction to the second block. The interspaces between the blocks can be incompletely filled by the connection structure.

Furthermore, adjacent blocks can also be connected by the connection structure in a second lateral direction, which is perpendicular to the lateral direction mentioned above.

A construction of the piezoelectric layer can arise in which the connection structure has first webs running parallel to one another and extending in the lateral direction, and likewise has second webs running parallel to one another and extending perpendicularly to the first webs of the first connection structure in the second lateral direction. The first and second webs can also be arranged at some other angle with respect to one another. By way of example, the piezoelectric layer and the webs can be arranged in such a way that the first and second webs form angles of 30°, 45° or 60°.

A respective block can be arranged at the points of intersection of the first webs and the second webs of the connection structure. Furthermore, an interspace can remain free between the webs and blocks. The interspace can be filled, for example, with a vacuum, with air or with a dielectric material.

The dielectric material can have further advantageous properties that influence the resonator in a desired manner. By way of example, the dielectric material can have an abnormal thermomechanical behavior that can minimize the temperature response of the resonator. The dielectric material can be a stiff or hard material having a low or negative coefficient of expansion, such that it can likewise influence the temperature response of the resonator via the stress that occurs. The coefficient of expansion of the dielectric material can be in particular less than the coefficient of expansion of the piezoelectric material.

Materials that differ from the piezoelectric material in their elastic properties can furthermore be used e.g. to suppress disturbance modes that possibly occur, or to influence the frequency thereof.

The webs, too, can be embodied from such a dielectric material having at least some of the properties described above.

A structure composed of two blocks laterally coupled to one another and the connection structure arranged therebetween can be excited to effect a surface-wave-like oscillation, for example, a genuine surface wave or a Lamb wave, upon an oscillation of the blocks. In this case, the blocks can be coupled in opposite directions to one another. The connection structure can contribute to an additional increase in the coupling factor.

Furthermore, a region of the piezoelectric layer can be covered by a cladding layer having an anomalous thermomechanical behavior and/or a lower stiffness than the piezoelectric layer.

If the piezoelectric layer comprises blocks, then at least one of the blocks can be enveloped by a cladding layer having an abnormal thermomechanical behavior. In this case, the cladding layer can compensate for a normal thermomechanical behavior of the material of the block. Accordingly, overall the temperature sensitivity of the electroacoustic transducer is reduced, i.e. the temperature coefficients of the resonant and antiresonant frequency of the overall structure are minimized in terms of absolute value.

The cladding layer can bring about a strain of the piezoelectric layer. This strain influences the temperature behavior of the transducer and can bring about a temperature compensation in this way.

The cladding layer can furthermore also be used for other purposes. The cladding layer can comprise a stiff or hard material having a low or negative coefficient of expansion, such that the temperature response of the transducer can likewise be influenced via strains that occur. The coefficient of expansion of the cladding layer can be in particular less than the coefficient of expansion of the piezoelectric material.

Furthermore, the cladding layer can comprise a dielectric material which has at least some of the properties mentioned above for dielectric materials and which influences the frequency and/or temperature behavior of the transducer in a desired manner.

However, the cladding layer can also have properties that protect the piezoelectric layer against environmental influences. By way of example, the cladding layer can provide for a passivation.

If the piezoelectric layer is structured by holes and/or slots, then the side walls of the holes and/or slots can be covered with the cladding layer. In this case, too, the cladding layer can compensate for a normal thermomechanical behavior of the piezoelectric layer and thus reduce the temperature sensitivity of the electroacoustic transducer.

The abnormal thermomechanical behavior of the cladding layer can consist, for example, in the fact that the material of the cladding layer stiffens in the event of a temperature increase.

The piezoelectric layer can have cutouts filled with a material having an abnormal thermomechanical behavior or passivating properties. A dielectric material can be involved, for example. In this case, the dielectric material can have at least some of the properties discussed above for dielectric materials. In this way, the dielectric material can influence the frequency and/or temperature behavior of the transducer.

The filling material can be $Al_2O_3$, $Si_3N_4$ or $SiO_2$, for example.

The cutouts can be the holes and/or the slots with which the piezoelectric layer can be structured. The cutouts can also be interspaces between two blocks of the piezoelectric layer.

The material with which the cutouts are filled can be a dielectric material. A temperature sensitivity of the electroacoustic transducer is compensated for on account of the abnormal thermomechanical behavior of the material.

The piezoelectric layer of the electroacoustic transducer can be arranged on an acoustic mirror. The acoustic mirror can be produced by a stack construction in which different layers of the stack have a different acoustic impedance. Accordingly, a wave that emerges from the piezoelectric layer is reflected back from the mirror.

Alternatively the transducer can be arranged on a substrate, for example, a silicon substrate, a sapphire, SiC, spinel or diamond, or in a freely suspended fashion.

The piezoelectric layer can form a phononic bandgap structure. In a phononic bandgap structure, no traveling acoustic waves propagate in two or three spatial directions in a stopband frequency range.

The piezoelectric layer can comprise a first partial layer composed of a piezoelectric material and a second partial layer composed of a piezoelectric material, and the electroacoustic transducer can comprise an intermediate layer arranged between the first partial layer and the second partial layer. The intermediate layer can have a thermomechanical behavior opposite to that of the piezoelectric material, in particular an abnormal thermomechanical behavior. In this way, the intermediate layer ensures that the temperature coefficients of the resonant and antiresonant frequencies of the transducer are minimized.

The intermediate layer can also be arranged between the first electrode and the piezoelectric layer or between the piezoelectric layer and the second electrode.

The intermediate layer can consist of one of the following materials or comprise at least one of the following materials: $SiO_2$, $GeO_2$, $TeO_2$, $BeF_2$, $B_2O_3$ or zinc metaphosphate.

A different method for minimizing the temperature coefficients of the resonant and antiresonant frequencies of the transducer in terms of absolute value is described below:

The intermediate layer can bring about a strain of the piezoelectric layer. This strain influences the temperature behavior of the transducer and can bring about a temperature compensation in this way.

The intermediate layer can furthermore also be used for other purposes. The intermediate layer can comprise a stiff or hard material having a low or negative coefficient of expansion, such that the temperature response of the transducer can likewise be influenced via strains that occur. The coefficient of expansion of the intermediate layer can be in particular less than the coefficient of expansion of the piezoelectric material.

Furthermore, by means of the intermediate layer, the frequency can be changed or disturbance modes that possibly occur can be influenced.

The piezoelectric layer comprises a crystal structure which can be selected from one of the crystal classes 1, 3, m, 3m, $\bar{6}$, 32, 2, mm2, 4, $\bar{4}$, 4mm, 222, 23, $\bar{4}$3m, 6 and 6mm.

In this case, the definition of the crystal structures corresponds to the definition from Nye, J. F. "Physical Properties of Crystals". In this case, the crystal structure is described by a crystal coordinate system having the crystallographic axes a, b, c. Furthermore, the alternating electric field is described by the coordinate axes x, y, z. In accordance with this definition:

in monoclinic crystal classes, the crystallographic b-axis is parallel to the y-coordinate axis, in tetragonal, trigonal and hexagonal crystal classes, the crystallographic c-axis is parallel to the z-coordinate axis and the crystallographic a-axis is parallel to the x-coordinate axis, and in orthorhombic and cubic crystal classes, the crystallographic a-axis is parallel to the x-coordinate axis, the crystallographic b-axis is parallel to the y-coordinate axis and the crystallographic c-axis is parallel to the z-coordinate axis.

The excited oscillation mode of the oscillation with oscillations in three spatial directions can comprise a longitudinal oscillation, a shear oscillation or a combination of the two.

The piezoelectric layer can comprise crystallites whose crystal axis is aligned predominantly parallel. Advantageously, the layer is quasi epitaxial or epitaxial. It is sufficient, however, if, in a measuring method for determining orientation, for example, by means of electron backscatter diffraction (EBSD) or x-ray diffraction (XRD), a preferred orientation of the piezoelectric layer can be identified at least with respect to one crystal axis. The piezoelectric layer should not be amorphous or polycrystalline or nanocrystalline.

For the crystal classes 6 and 6mm, to which in particular AlN and ZnO belong, only a preferred orientation of the crystallites with respect to the crystallographic c-axis is necessary, since there is transverse isotropy about this axis, i.e. said materials are invariant with regard to their properties upon rotation about this axis.

BRIEF DESCRIPTION OF THE DRAWINGS

The invention is explained in greater detail below on the basis of exemplary embodiments and the associated figures. The figures show various exemplary embodiments of the invention on the basis of schematic illustrations that are not true to scale.

In the figures.

DETAILED DESCRIPTION OF ILLUSTRATIVE EMBODIMENTS

Figure 1:
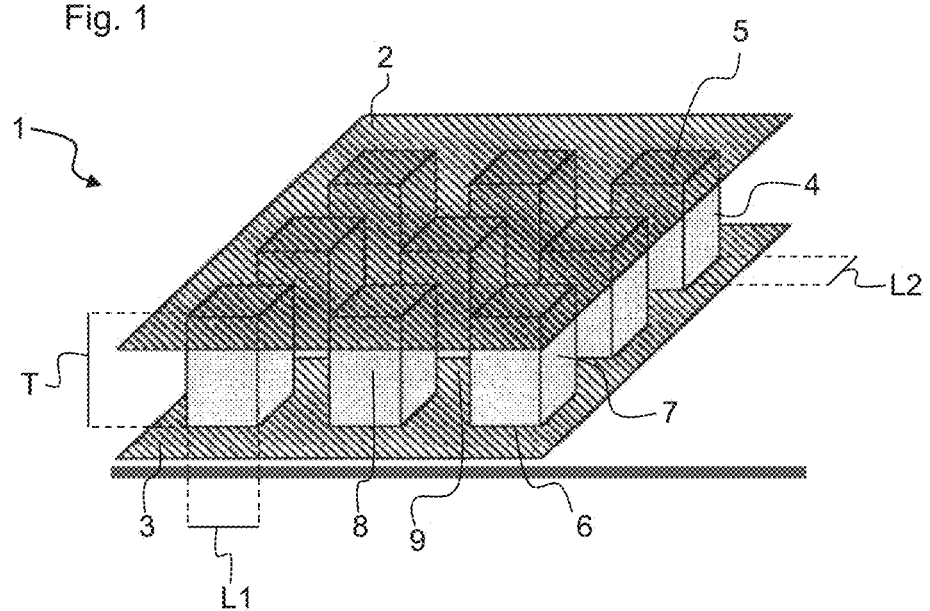
FIG. 1 shows an electroacoustic transducer.

FIG. 1 shows an electroacoustic transducer 1. This is a transducer that operates with bulk acoustic waves. The transducer 1 comprises a first electrode 2 and a second electrode 3. A piezoelectric layer 4 is arranged between the first electrode 2 and the second electrode 3. The piezoelectric layer 4 has a top side 5 and an underside 6, wherein the underside 6 is opposite the top side 5. The top side 5 bears against the first electrode 2. The underside 6 bears against the second electrode 3. Furthermore, the piezoelectric layer has a side surface 7 arranged perpendicular to the top side 5 and the underside 6. The side surface 7 is free of the electrodes 2, 3.

If an AC voltage is applied between the first and second electrodes 2, 3, then a bulk acoustic wave is generated in the piezoelectric layer 4 as a result.

The piezoelectric layer 4 comprises a plurality of blocks 8 each comprising a piezoelectric material. Cutouts 9 are situated between the blocks 8. No piezoelectric material is arranged in the cutouts 9 of the piezoelectric layer 4. Accordingly, the blocks 8 are insulated from one another.

The piezoelectric layer 4 is structured in such a way that, in the case of an alternating electric field applied in one spatial direction, an oscillation mode with oscillations in three spatial directions is excited. In particular, a first electrical potential can be applied to the first electrode 2 and a second electrical potential can be applied to the second electrode 3. Accordingly, an alternating electric field forms which is directed from the first electrode 2 toward the second electrode 3.

The blocks 8 of the piezoelectric layer 4 are structured in such a way that they are excited to effect an oscillation mode with oscillations in three spatial directions by the alternating electric field present between the first and second electrodes 2, 3. A three-dimensional oscillation mode is involved in this case. The oscillation mode has one oscillation component in a direction along the alternating electric field and two oscillation components in the two further spatial directions. Both longitudinal waves and shear waves can be excited in this case.

As a result of the excitation of the three-dimensional oscillation mode, the coupling factor of the transducer 1 is increased compared with a one-dimensional oscillation mode, since the three-dimensional oscillation mode utilizes more components of the piezo-tensor than the one-dimensional oscillation mode. This is possible if the structure of the piezo-tensor is constituted such that when an alternating electric field is applied in one spatial direction, an excitation is effected in all three spatial directions. This is the case, for example, for piezo-materials having one of the following crystal structures:

In the case of the crystal structures 1 and $\bar{3}$, provided that the alternating electric field is applied in the x-, y- or z-direction.

In the case of the crystal structure m, provided that the alternating electric field is applied in the x- or z-direction.

In the case of the crystal structure 3m, provided that the alternating electric field is applied in the y- or z-direction.

In the case of the crystal structure $\bar{6}$, provided that the alternating electric field is applied in the x- or y-direction.

In the case of the crystal structure 32, provided that the alternating electric field is applied in the x-direction.

In the case of the crystal structure 2, provided that the alternating electric field is applied in the y-direction.

In the case of each of the crystal structures mm2, 4, $\bar{4}$, 4mm, 6 and 6mm, provided that the alternating electric field is applied in the z-direction.

In the case of the crystal structures 3, 3m, mm2, 4, 4mm, 6 and 6mm, it is possible here to excite oscillations without a proportion of a shear oscillation.

Furthermore, for piezo-materials having other crystal structures as well, an oscillation mode with oscillations in three spatial directions can be achieved by the application of an alternating electric field, if the alternating electric field is not applied exactly along a coordinate axis. In this regard, e.g. applying an alternating electric field along the space diagonal in the case of the crystal classes 222, 23 and $\bar{4}$3m produces shear oscillations in all three spatial directions. This possibility also exists for the piezo-materials mentioned above.

An oscillation mode with oscillations in three spatial directions can be excited for a piezoelectric layer 4 if the piezoelectric layer 4 has an oriented region. The oriented region is characterized in that a crystal axis of the crystallites or of the grains of the piezoelectric material is aligned predominantly parallel in this region. In this case, parallel should not be understood in the exact mathematical sense, but rather as "facing in the same direction apart from a deviation of a few degrees". The piezoelectric layer 4 is accordingly not amorphous or poly- or nanocrystalline.

Instead, the piezoelectric layer 4 can be quasi epitaxial or epitaxial. For exciting a three-dimensional oscillation mode it is sufficient if, in a method for determining orientation, for example, by means of electron backscatter diffraction (EBSD) or x-ray diffraction (XRD), a preferred orientation of the piezoelectric layer 4 can be identified at least with respect to one crystal axis.

The extent of the block 8 in a direction in which the speed of sound in the piezoelectric layer is the highest is designated by T. The extents of the block 8 in the two further spatial directions are designated as L1 and L2.

The extent T of the blocks 8 in the direction in which the speed of sound in the piezoelectric layer is the highest can be chosen such that the resonator is operated in the fundamental mode. For this purpose, the thickness of the piezoelectric layer can be between 30 and 70% of the acoustic wavelength of the resonant frequency of the transducer 1. Preferably, the dimensioning of the block 8 in this direction is between 40 and 60% of the acoustic wavelength of the resonant frequency of the transducer. Furthermore, it is also conceivable for the resonator to be operated in a harmonic mode.

In the case of the exemplary embodiment shown in FIG. 1, the speed of sound is the highest in the direction that is parallel to the surface normals of the first and second electrodes 2, 3. In the exemplary embodiment shown in FIG. 1, the extent T of the blocks 8 in the direction in which the speed of sound in the piezoelectric layer is the highest is thus equal to the distance between the first electrode 2 and the second electrode 3.

In other exemplary embodiments, the direction in which the speed of sound in the piezoelectric layer 4 is the highest can assume any other arbitrary angle with respect to the surface normals of the first and second electrodes 2, 3. The direction in which the speed of sound of an excitable mode is the highest is dependent on the orientation of the piezoelectric layer 4 or the grains or the crystallites of the piezoelectric layer 4 with respect to the applied alternating electric field.

The extents L1, L2 of the block 8 in the remaining spatial directions are at most of just the same magnitude as the extent T of the block 8 in the direction of the highest speed of sound.

Accordingly, the following design specifications indicating the aspect ratios A1, A2 of the blocks result for the blocks 8 of the piezoelectric layer 4:

$$A1 = T/L1 \geq 1 \text{ and } A2 = T/L2 \geq 1.$$

The aspect ratios A1, A2 indicate the ratios of the extent T of the blocks 8 along the direction of the highest speed of sound to the extents L1, L2 in the remaining directions. If the extents L1 and L2 are in each case equal to L in the case of isotropic structures, then the design specification for the blocks 8 can be indicated by a single aspect ratio, which must fulfill the following design specification:

$$A = T/L \geq 1.$$

Proceeding from this design specification, for a frequency in the 1 GHz range, blocks 8 result which have a very small extent T, L1, L2 in all spatial directions. By way of example, the blocks 8 can have dimensions in the micrometers range. For this reason, many of said blocks 8 are electrically interconnected in parallel with one another. Accordingly, the piezoelectric layer 4 comprises an array of blocks 8. It is not necessary here for each of the blocks 8 to fulfill the design specification mentioned above. A significant portion of the blocks 8, for example, at least 70% of the blocks 8, fulfils the design specification mentioned above.

In FIG. 1, the top side 5 and the underside 6 of the blocks 8 in each case have a square shape. In principle, any arbitrary shape is possible for the top side 5 and the underside 6 of the blocks 8, for example, rectangles, parallelograms, other quadrilaterals, ellipses, circles, hexagons, dodecagons, further n-gons and regular polygons. Furthermore, the top side 5 and the underside 6 of a block 8 need not have the same shape.

For piezoelectric layers 4 whose crystals belong to the group 6mm, squares, regular hexagons and regular dodecagons have proved to be particularly advantageous shapes of the top side 5 and the underside 6. In this case, the symmetry properties of the piezo-tensor can be utilized particularly well.

By virtue of the suitable choice of the shape of the top side 5 and of the underside 6, the position and excitability of further disturbing oscillation modes can be influenced, while the coupling factor of the fundamental mode does not change significantly. Accordingly, possibly disturbing secondary modes can be suppressed by a skillful shaping of the blocks 8.

The block 8 need not have exact 90° edges, but rather can also have convex or concave edges. Accordingly, the block 8 can thicken or taper. What is crucial here is not the edge shape, but rather the aspect ratio described above.

In the case of the exemplary embodiment shown in FIG. 1, the first electrode 2 and the second electrode 3 each have a continuously planar shape.

Figure 2:
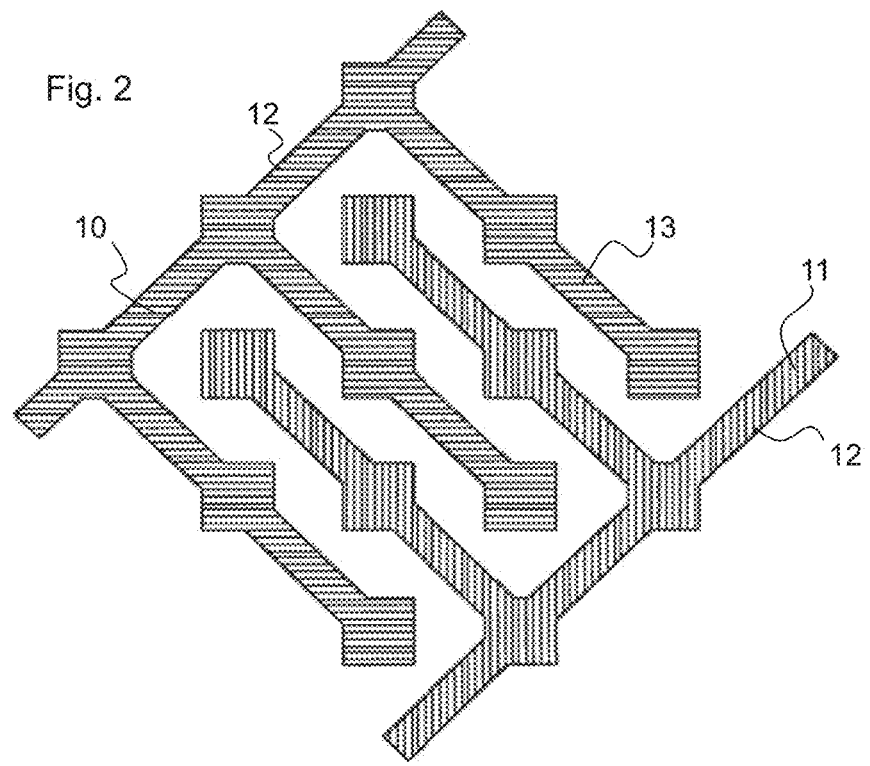
FIG. 2 shows an electrode.

FIG. 2 shows an alternative configuration of an electrode 2, 3. This can be the first or the second electrode 2, 3.

The electrode 2, 3 shown in FIG. 2 comprises a first electrode structure 10 and a second electrode structure 11. The first electrode structure 10 and the second electrode structure 11 are spatially separated from one another.

The first and second electrode structures 10, 11 are configured in each case in a comb-shaped fashion. The first and second electrode structures 10, 11 each have an outer strip 12 extending in a first spatial direction. In this case, the first spatial direction is perpendicular to the surface normal of the respective electrode structure 10, 11. Furthermore, the first and second electrode structures 10, 11 have finger-like strips 13 each extending in a manner proceeding from the outer strip 12 toward the respective other electrode structure 10, 11. In this case, the finger-like strips 13 are perpendicular to the respective outer strip 12. The finger-like strips 13 are not connected to the opposite electrode structure 10, 11.

The finger-like strips 13 of the two electrode structures 10, 11 intermesh. The outer strips 12 and the finger-like strips 13 in each case connect a plurality of blocks 8 arranged in a series to one another. In this case, the blocks 8 and the electrode structures 10, 11 are arranged in such a way that blocks 8 that are adjacent in one direction are alternately connected to the first and second electrode structures 10, 11.

Accordingly, a configuration of the electrode 2, 3 comprising two electrode structures 10, 11 makes it possible to connect adjacent blocks 8 to different electrode structures 10, 11. If a different potential is then applied to the two electrode structures 10, 11, the adjacent blocks 8 are coupled in opposite directions. Nonlinearities of the transducer 1 can be suppressed in this way.

By way of example, the first electrode 2 of the transducer 1 can have a continuous planar shape, as shown in FIG. 1, to which a reference potential is applied. The reference potential can be a ground potential, for example. Furthermore, the second electrode 3 can have a configuration in accordance with FIG. 2, wherein different potentials are applied to the first and second electrode structures 10, 11.

Alternatively, both the first and the second electrode 2, 3 can have a first and a second electrode structure 10, 11. In this case, too, adjacent blocks 8 can be coupled in opposite directions to one another, such that nonlinearities of the transducer 1 are compensated for.

Figure 3:
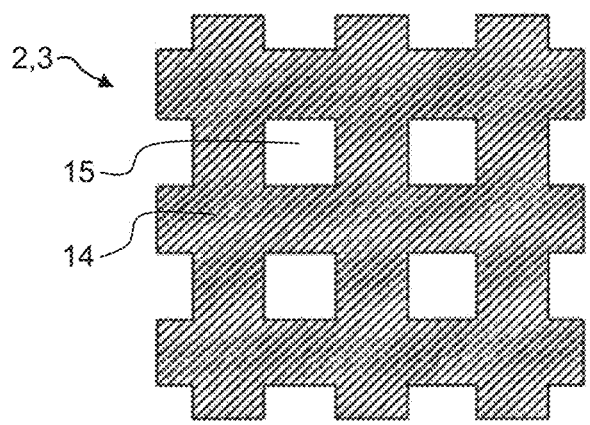
FIG. 3 shows an alternative embodiment of the electrode.
Figure 4:
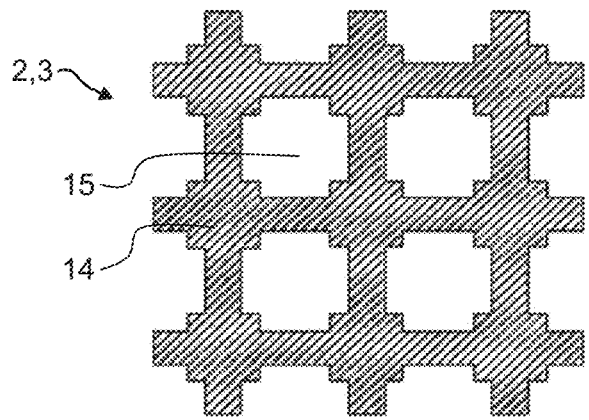
FIG. 4 shows a further alternative embodiment of the electrode.

FIGS. 3 and 4 show further embodiments of the electrodes 2, 3. The electrodes shown in FIGS. 3 and 4 have a perforated lattice structure. The perforated lattice structure has closed regions 14 and openings 15. This embodiment of an electrode 2, 3 is possible both for the first and for the second electrode 2, 3. The embodiments of the electrode 2, 3 as shown in FIGS. 1 to 4 can be combined with one another arbitrarily as first and second electrodes 2, 3.

Figure 5:
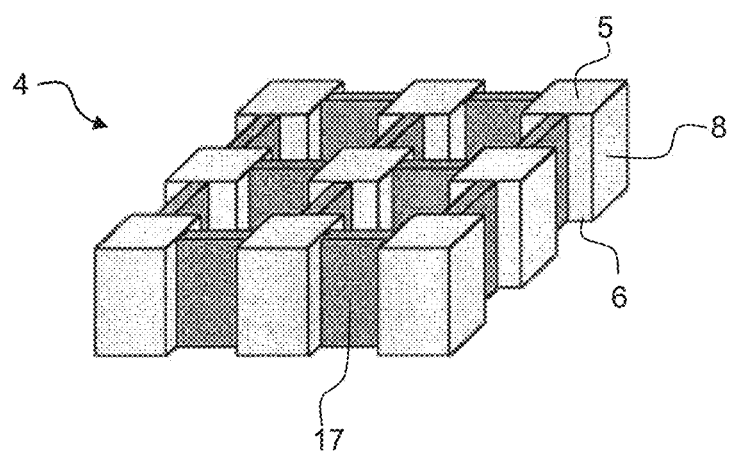
FIG. 5 shows a piezoelectric layer with connection structure in a perspective view.

FIG. 5 shows a further exemplary embodiment of the piezoelectric layer 4. The piezoelectric layer 4 here has a connection structure 17. The connection structure 17 is arranged between two adjacent blocks 8 and connects the two blocks 8 to one another in a lateral direction. The lateral direction is perpendicular to the surface normals of the top side 5 and the underside 6 of the blocks 8.

The arrangement comprising the laterally coupled blocks 8 and the connection structure 17 can generate a surface wave or a Lamb wave. If two directly adjacent blocks 8 are coupled in opposite directions and are connected to one another laterally by the connection structure 17, then the arrangement comprising the two blocks 8 and the connection structure 17 is furthermore moved in a surface-wave-like manner by the bulk acoustic waves excited in the blocks 8.

The connection structure 17 comprises a dielectric material or consists of such a material.

The embodiment of the piezoelectric layer 4 with the connection structure 17 as shown in FIG. 5 can particularly advantageously be combined with one of the embodiments of the electrode 2, 3 having the perforated lattice structure as shown in FIGS. 3 and 4. In this case, the electrode 2, 3 can be positioned on the piezoelectric layer 4 in such a way that the openings 15 of the perforated lattice structure respectively lie above the cutouts 9 of the piezoelectric layer 4 in which neither one of the blocks 8 nor the connection structure 17 is arranged. Respectively closed regions 14 of the electrode 2, 3 then bear on the connection structure 17. In this case, the connection structure 17 provides for a high mechanical stability of the electrode 2, 3 since the connection structure 17 provides a large bearing area. Furthermore, the connection structure 17 simplifies the production method since the electrode 2, 3 can be applied directly on the connection structure 17.

The cutouts 9 between the blocks 8 can be filled with a dielectric material in any of the embodiments discussed above. As a result, the blocks 8 can likewise be laterally coupled to one another. As already discussed in association with the connection structure 17 shown in FIG. 5, a lateral coupling of the blocks 8 has the effect that a surface-wave-like wave is excited between blocks 8 coupled in opposite directions.

The dielectric material that fills the cutouts 9 between the blocks 8 can have an abnormal thermomechanical behavior. By way of example, the dielectric material can stiffen upon heating on account of the abnormal thermomechanical behavior. Accordingly, the abnormal thermomechanical behavior of the dielectric material compensates for the typically normal thermomechanical behavior of the blocks 8. The dielectric material arranged in the cutouts 9 between the blocks 8 makes it possible to minimize the temperature coefficients of the resonant and antiresonant frequencies of the transducer 1 in terms of absolute value.

Furthermore, the dielectric material filling the cutouts 9 between the blocks 8 can have at least some of the properties mentioned above for dielectric materials and can influence the frequency and/or temperature behavior of the transducer in a desired manner.

However, the dielectric material filling the cutouts 9 between the blocks 8 can also have properties that protect the piezoelectric layer against environmental influences. By way of example, it can provide for a passivation.

As an alternative or in addition to filling the cutouts 9 with the dielectric material having abnormal thermomechanical properties, the blocks 8 can be enveloped by a cladding layer comprising a material having an abnormal thermomechanical behavior. Such a cladding layer also makes it possible to compensate for the thermomechanical behavior of the blocks 8 and to minimize the temperature coefficients of the resonant and antiresonant frequencies of the transducer 1 in terms of absolute value.

Furthermore, the cladding layer can comprise a dielectric material which has at least some of the properties mentioned above for dielectric materials and which influences the frequency and/or temperature behavior of the transducer in a desired manner.

However, the cladding layer can also have properties that protect the piezoelectric layer against environmental influences. By way of example, the cladding layer can provide for a passivation.

Figure 6:
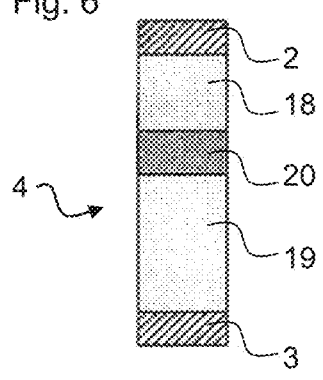
FIG. 6 shows a schematic cross section through a part of the transducer.

FIG. 6 shows a schematic cross section through a part of the transducer 1. FIG. 6 shows the first and second electrodes 2, 3. The piezoelectric layer 4 is arranged between the first and second electrodes 2, 3. The piezoelectric layer 4 comprises a first partial layer 18 comprising a piezoelectric material, and a second partial layer 19 likewise comprising a piezoelectric material.

Furthermore, the transducer 1 comprises an intermediate layer 20. The intermediate layer 20 is arranged between the first and second partial layers 18, 19 of the piezoelectric layer 4. Alternatively, the intermediate layer 20 can also be arranged between one of the electrodes 2, 3 and the piezoelectric layer 4. The intermediate layer 20 can have abnormal thermal properties. As a result, it ensures that the thermal properties of the piezoelectric layer 4 are compensated for and the frequency characteristic of the transducer 1 can be kept as stable as possible over various temperatures. Accordingly, the intermediate layer 20 makes it possible to minimize the temperature coefficients of the resonant and antiresonant frequencies of the transducer 1 in terms of absolute value.

If the intermediate layer 20 has an abnormal thermomechanical behavior, then it can be used for temperature compensation. In this case, the intermediate layer 20 can consist of one of the following materials or comprise at least one of the following materials: $SiO_2$, $GeO_2$, $TeO_2$, $BeF_2$, $B_2O_3$ or zinc metaphosphate.

Figure 7:
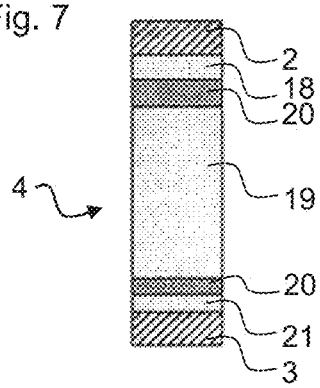
FIG. 7 shows an alternative embodiment of the transducer in cross section.

FIG. 7 shows an alternative embodiment of the transducer 1 in cross section. Here the transducer 1 comprises two temperature compensation layers 20. Furthermore, the piezoelectric layer 4 comprises the first partial layer 18, the second partial layer 19 and a third partial layer 21. Partial layers 18, 19, 21 of the piezoelectric layer 4 and temperature compensation layers 20 are arranged alternately between the two electrodes 2, 3.

In the exemplary embodiments shown here, the blocks 8 are always arranged regularly. However, it is also possible for the blocks 8 to be arranged partly or completely irregularly. The arrangement of the blocks 8 can follow a modulation or be totally random.

Furthermore, blocks 8 of different sizes can be combined with one another in a transducer 1. If the thickness of the blocks 8 in the direction of the surface normal of the top side 5 is identical and if the blocks 8 differ in their widths, i.e. in their extents in the spatial directions perpendicular to the surface normal of the top side 5, then a smearing of the disturbance modes of the transducer 1 is made possible as a result.

The transducer 1 can be arranged on a stack of layers, wherein the layers differ in their acoustic impedance. In particular, the layers can form an SMR-type mirror (SMR=Solidly Mounted Resonator). The layers having different acoustic impedances reflect waves emerging from the piezoelectric layer 4 back into the latter.

Alternatively, the transducer 1 can be arranged on a substrate material, for example, silicon, sapphire, SiC or spinel. Furthermore, the transducer 1 can also be arranged in a freely suspended fashion.

In any of the exemplary embodiments described here, the blocks 8 can form a phononic bandgap structure. Accordingly, no traveling acoustic waves propagate in two or three spatial directions in a stopband frequency range.

In accordance with a further exemplary embodiment, the piezoelectric layer 4 can also be structured by holes 22 and slots 23. Examples of piezoelectric layers 4 that are structured by holes 22 and/or slots 23 can be found in FIGS. 8 to 26. These figures in each case show a cross section through the piezoelectric layer 4 of the transducer 1, wherein the sectional plane is parallel to the top side 5 of the piezoelectric layer 4.

Figure 8:
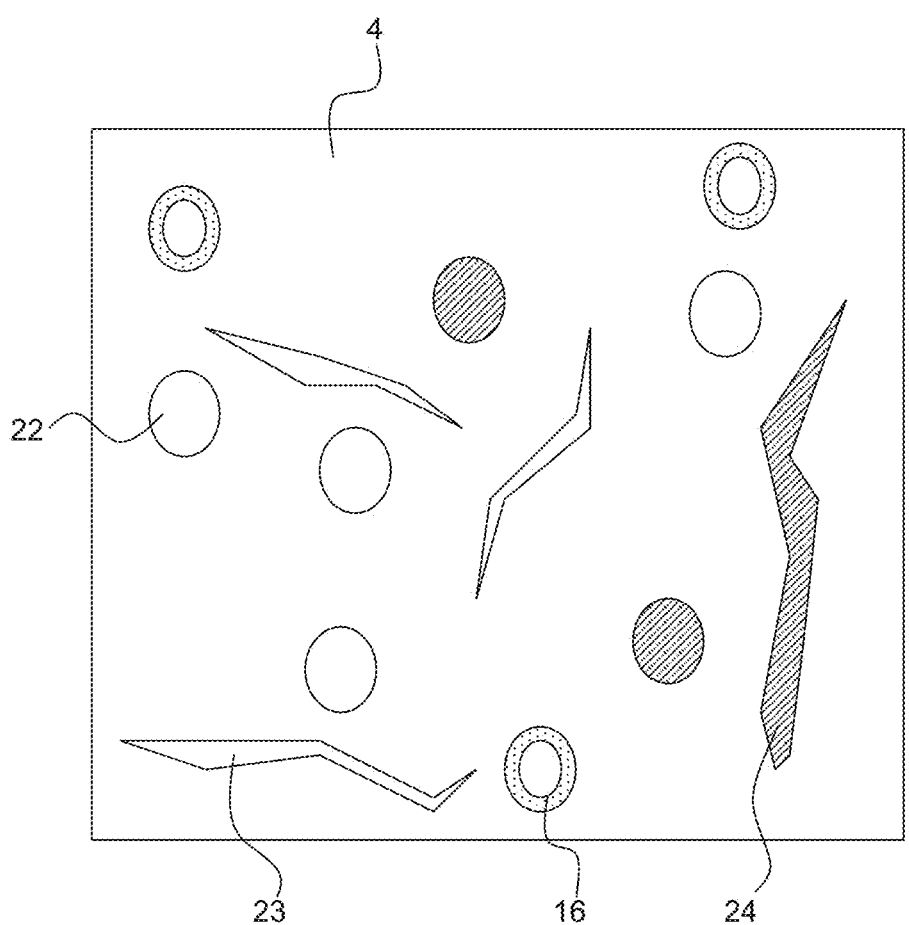
FIGS. 8 to 26 in each case show cross sections through piezoelectric layers of the transducer in accordance with various exemplary embodiments.

FIG. 8 shows a cross section through a piezoelectric layer 4 structured with randomly arranged holes 22 and slots 23.

The side walls of some of the holes 22 have furthermore been covered with a cladding layer 16 having an anomalous thermomechanical behavior. Said cladding layer 16 compensates for the normal thermomechanical behavior of the piezoelectric layer 4. The side walls of the slots 23 could also be covered with the cladding layer 16.

Furthermore, the cladding layer can comprise a dielectric material which has at least some of the properties mentioned above for dielectric materials and which influences the frequency and/or temperature behavior of the transducer in a desired manner.

However, the cladding layer can also have properties that protect the piezoelectric layer against environmental influences. By way of example, the cladding layer can provide for a passivation.

Furthermore, some of the holes 22 and some of the slots 23 are filled with a dielectric material 24 having an abnormal thermomechanical behavior. Any material having an abnormal thermomechanical behavior can be used for this purpose.

Furthermore, the filling material can comprise a dielectric material which has at least some of the properties mentioned above for dielectric materials and which influences the frequency and/or temperature behavior of the transducer in a desired manner.

However, the filling material can also have properties that protect the piezoelectric layer against environmental influences. By way of example, the filling material can provide for a passivation.

In the exemplary embodiment in FIG. 1, the dielectric material 24 can furthermore fill the cutouts 9 between the blocks 8. Alternatively, the blocks 8 can be covered with the cladding layer 16.

Figure 9:
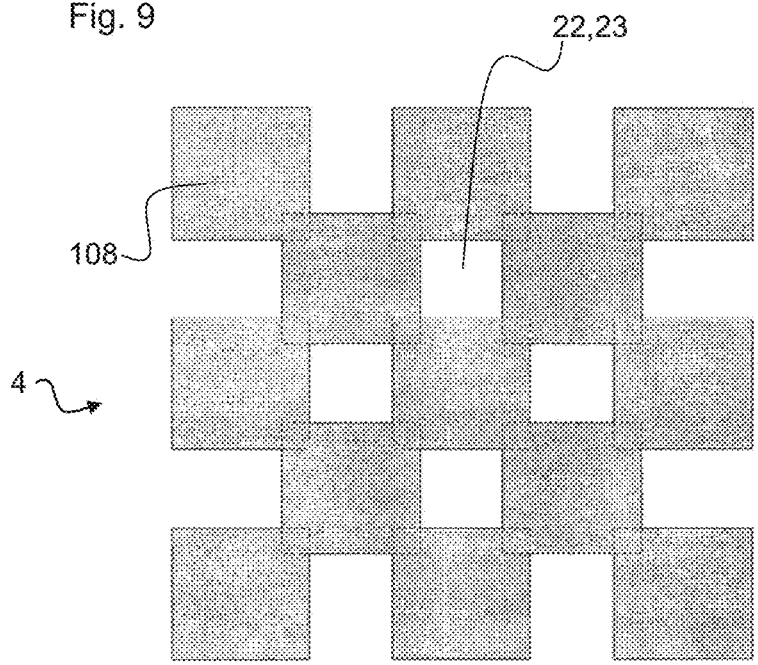
Figure 10:
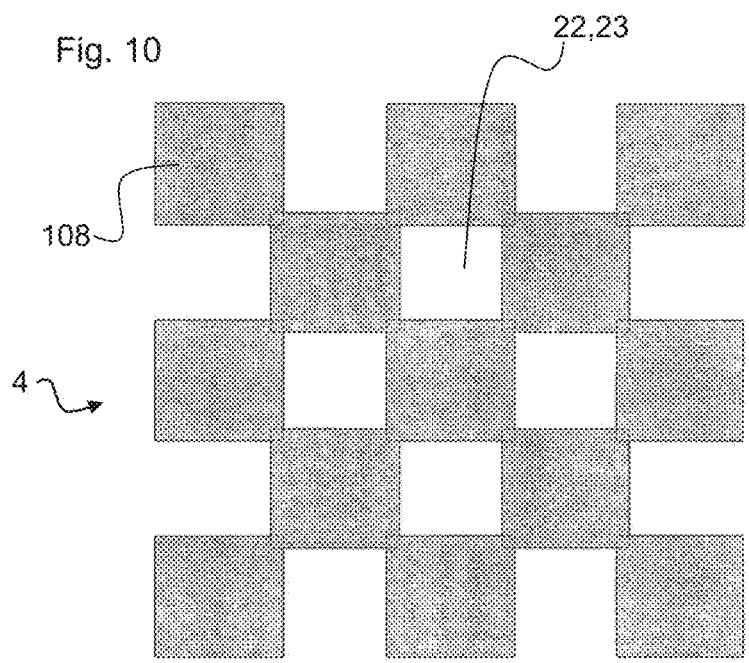
Figure 11:
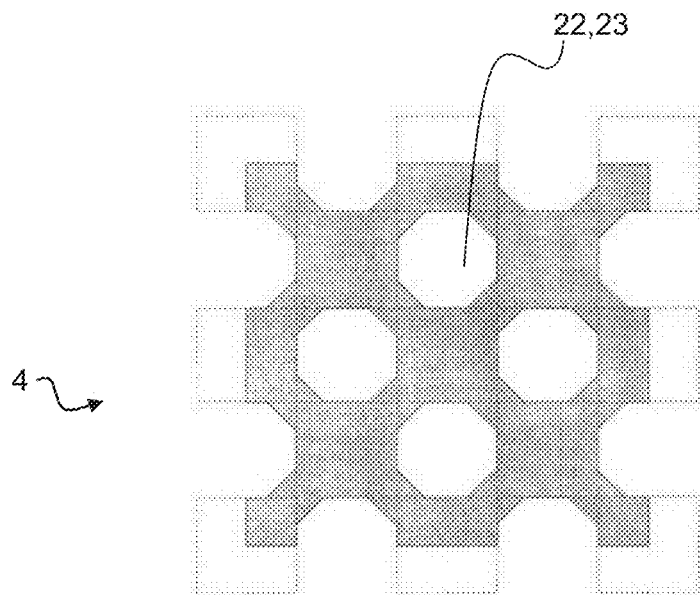
Figure 12:
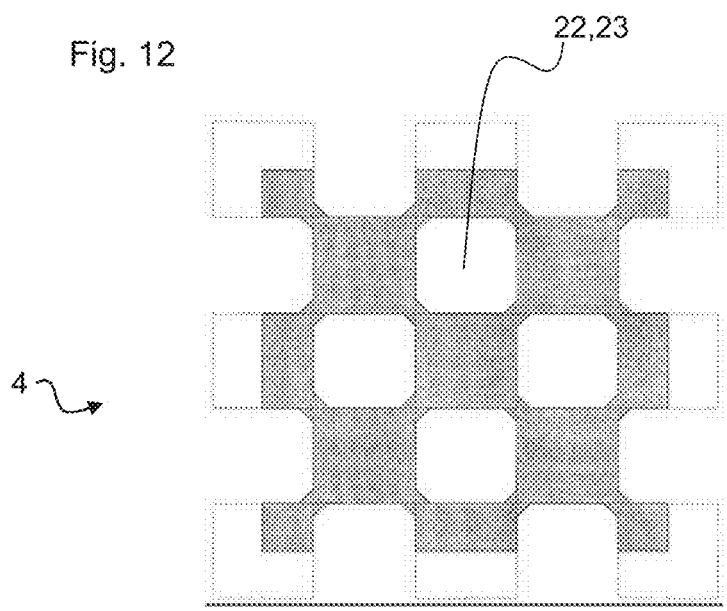
Figure 13:
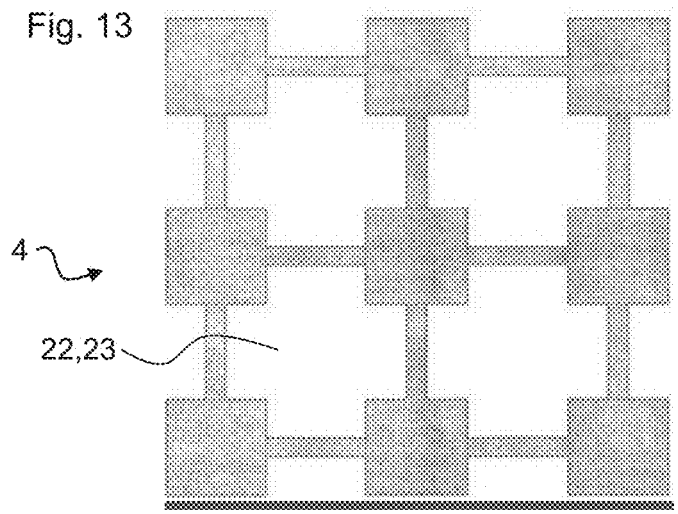
Figure 14:
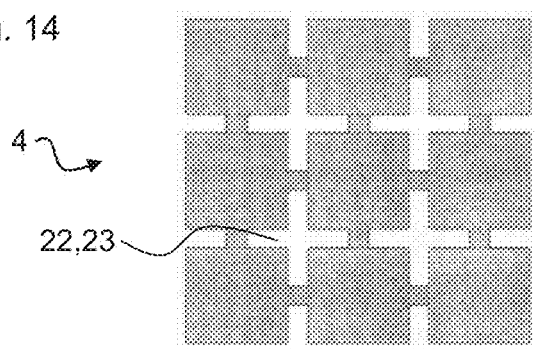
Figure 15:
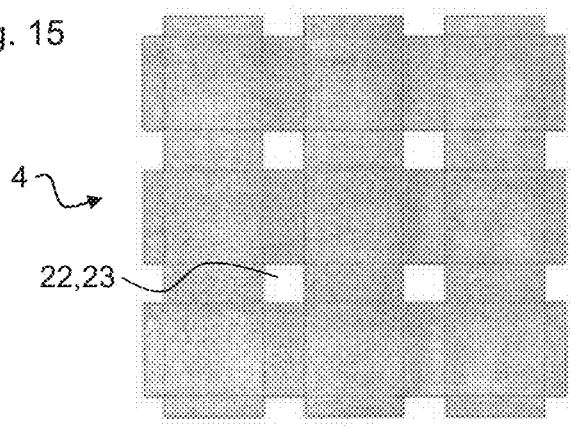
Figure 16:
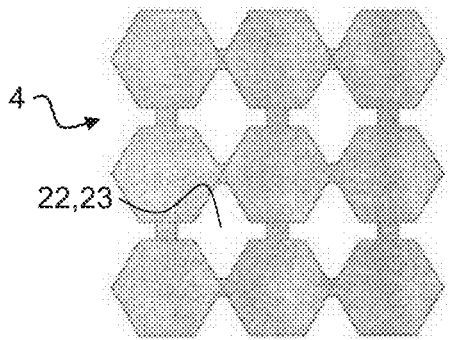
Figure 17:
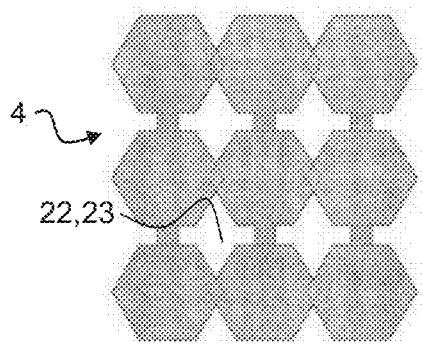
Figure 18:
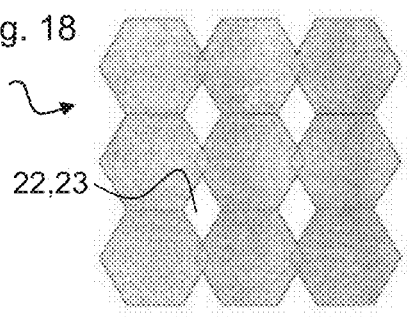
Figure 19:
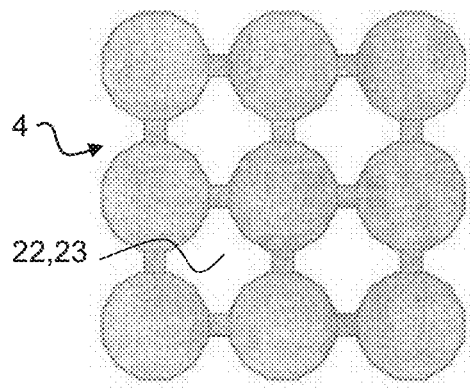
Figure 20:
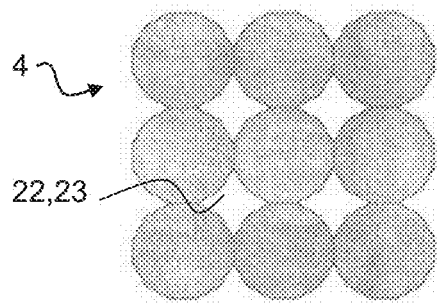
Figure 21:
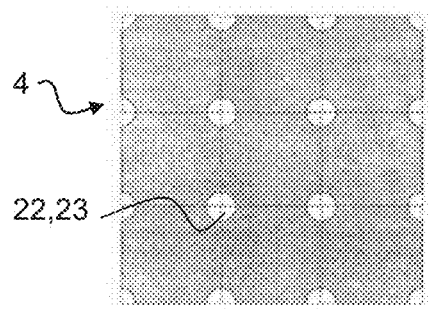
Figure 22:
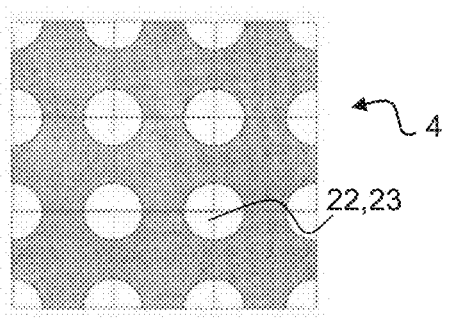
Figure 23:
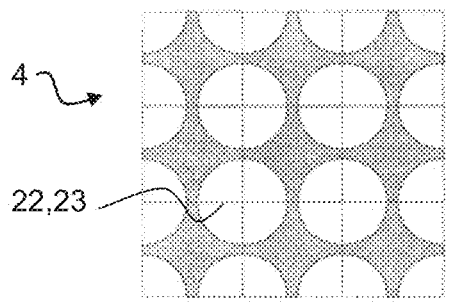
Figure 24:
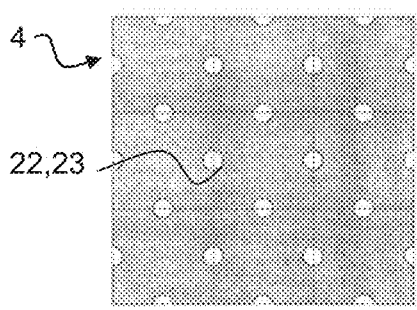
Figure 25:
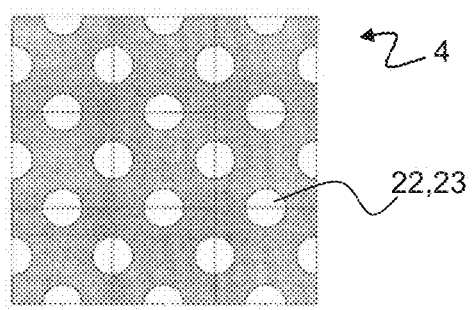
Figure 26:
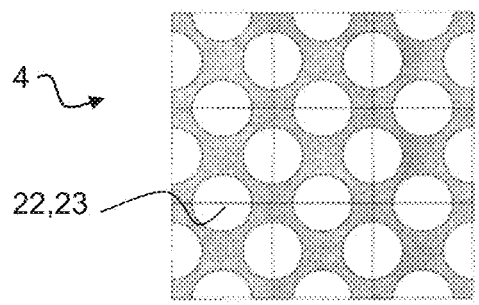

The piezoelectric layers 4 shown in FIGS. 9 and 10 arise as a result of the blocks 8 from FIG. 1 being pushed into one another. Accordingly, the piezoelectric layer 4 here no longer has blocks 8 insulated from one another, rather a connected structure arises. Surprisingly, it is found that the connected structure likewise has an increased coupling factor in comparison with a continuous piezoelectric layer. As discussed in association with the blocks 8 shown in FIG. 1, an oscillation mode with oscillations in three spatial directions is excited in the connected structure as well.

This surprising and unexpected result is explained when consideration is given to the piezo-structure of the individual blocks 8. The piezoelectric layer 4 shown in FIGS. 8 and 9 can be regarded as a structure composed of overlapping or linked blocks 108. The linking or overlapping of the blocks 108 has the effect that the three-dimensional oscillation modes can no longer form perfectly, i.e. completely, in the linked or overlapped blocks 108, but parts of the linked blocks 108 still contribute to this three-dimensional oscillation mode. The effect of the increase in the electromechanical coupling is thus smaller in this case than in the exemplary embodiment shown in FIG. 1, but still significant.

The holes 22 and slots 23 are positioned in such a way, and their size is chosen in such a way, that the piezoelectric layer 4 largely fulfills the abovementioned design specification for an aspect ratio $A \geq 1$. Accordingly, the excitation of a three-dimensional oscillation mode is still possible.

The embodiments of the blocks 8 discussed above are also possible for the connected structure having linked or overlapping blocks 108, as shown in FIGS. 9 and 10. Furthermore, these embodiments are also possible for a piezoelectric layer 4 structured with holes 22 and slots 23.

By way of example, a piezoelectric layer 4 configured in this way can be combined with an electrode 2, 3 having a first and a second electrode structure 10, 11, as shown in FIG. 2. Accordingly, different regions of the piezoelectric layer 4 can be coupled in opposite directions to one another.

The piezoelectric layer 4 shown here can be arranged on a layer stack having a varying acoustic impedance, on a substrate, for example, silicon, or in a freely suspended fashion. Furthermore, one or a plurality of temperature compensation layers 20 can be inserted into the piezoelectric layer 4, as shown in FIGS. 6 and 7.

The arrangement of the holes 22 in the piezoelectric layer 4 need not be regular. An arrangement which follows a modulation rule or which is implemented purely randomly is also possible. The holes 22 can also be arranged in such a way as to result in regions having different lateral extents in the piezoelectric layer 4. Accordingly, disturbance modes of the piezoelectric layer 4 can be smeared. The edges of the piezoelectric layer 4 are configured in a rectilinear fashion in each case in FIGS. 8 and 9. However, this edge shape is not absolutely necessary. Rather, convex or concave edges are also possible. Furthermore, any other edge shape is also possible.

The cutouts 9 between the linked or overlapping blocks 108 can be filled wholly or partly with one or a plurality of materials. These materials can be applied in an unstructured fashion, for example, as complete filling or as side wall covering, or can themselves have a structure, for example, relatively small holes. At least one of said materials can have an abnormal thermomechanical behavior and contribute in this way to a compensation of the normal thermomechanical behavior of the piezoelectric layer 4. In this way, the temperature coefficients of the resonant and antiresonant frequencies of the transducer can be kept small in terms of absolute value.

Furthermore, the filling material can comprise a dielectric material which has at least some of the properties mentioned above for dielectric materials and which influences the frequency and/or temperature behavior of the transducer in a desired manner.

However, the filling material can also have properties that protect the piezoelectric layer against environmental influences. By way of example, the filling material can provide for a passivation.

A piezoelectric layer 4 comprising linked or overlapping blocks 108 can also form a phononic bandgap structure.

FIGS. 10 to 26 show further embodiments of the piezoelectric layer 4. In FIGS. 10 to 26, the piezoelectric layer 4 departs more and more from blocks 108 pushed into one another toward a piezoelectric layer 4 that is structured by holes 22 and slots 23. Surprisingly, it is found that, for such a piezoelectric layer 4 as well, an increase in the coupling factor occurs in comparison with a continuous piezoelectric layer. Therefore, if holes 22 and/or slots 23 are produced in a continuously piezoelectric layer, then the coupling factor of the layer is increased as a result.

Therefore, blocks 8 as shown in association with FIG. 1 need not be discernible, rather only holes 22 and/or slots 23 need be present in the piezoelectric layer 4.

The explanation for this is that regions of the piezoelectric layer 4 still fulfill the design specification for the aspect ratio. The holes 22 and slots 23 give the material the opportunity to expand in a lateral direction sufficiently to enable the excitation of oscillation modes with oscillations in three spatial directions.

A definition of the aspect ratio A adapted to these exemplary embodiments is discussed below. In this case, the lateral extent L is considered to be the shortest connecting line of two adjacent holes 22. T still indicates the extent of the piezoelectric layer 4 in the direction of the highest speed of sound. This can be, for example, the extent of the piezoelectric layer 4 in the direction of the surface normal of the top side 5. This in turn results in the design specification $A=T/L \geq 1$. The piezoelectric layer 4 has to fulfill this design specification at least in some regions, in order to enable the excitation of an oscillation mode with oscillations in three spatial directions which leads to an increase in the coupling factor.

The embodiment of the piezoelectric layer 4 having holes 22 and/or slots 23 is particularly advantageous since it is the easiest to realize technologically. In particular, firstly a continuous piezoelectric layer 4 can be shaped, which is subsequently structured by the production of the holes 22 and/or slots 23.

The shape of the holes 22 can be circular, elliptical, arbitrarily polygonal and irregular. The exact shape of the holes 22 is irrelevant to the effect described. Rather, what is crucial is that the abovementioned design specification for the aspect ratio is fulfilled in substantial parts of the piezoelectric layer 4, for example, in at least 70% of the piezoelectric layer 4. Furthermore, the holes 22 need not have the same cross section in the direction of the surface normal of the underside 6. Moreover, the holes 22 can taper or widen.

The exemplary embodiments of the piezoelectric layer 4 that have already been described can also be employed for a piezoelectric layer 4 that is structured with holes 22 and/or slots 23. Specifically, the holes 22 and/or slots 23 can be arranged in such a way that the piezoelectric layer 4 forms a phononic bandgap structure.

The holes 22 and/or slots 23 can be filled with one or a plurality of materials, as described above. In particular, the material can be a material having an abnormal thermomechanical behavior that compensates for the thermomechanical properties of the piezoelectric layer 4. However, the holes 22 and/or slots 23 can also remain unfilled, such that a vacuum or air is situated in the holes 22 and/or slots 23.

Furthermore, the filling material can comprise a dielectric material which has at least some of the properties mentioned above for dielectric materials and which influences the frequency and/or temperature behavior of the transducer in a desired manner.

However, the filling material can also have properties that protect the piezoelectric layer against environmental influences. By way of example, the filling material can provide for a passivation.

The arrangement of the holes 22 and/or slots 23 need not be regular. It can be regular, partly regular or irregular. An irregular arrangement extends from a modulation to a regular arrangement through to a totally random arrangement.

Furthermore, holes 22 of different sizes can be combined with one another. In particular, the lateral dimensioning of the holes 22 can be varied with the layer thickness remaining constant. As a result, the properties of the transducer 1 are improved since a smearing of disturbance modes occurs.

Different hole shapes can be combined with one another.

Furthermore, as shown in FIGS. 7 and 8, one or a plurality of temperature compensation layers 20 can be inserted into the piezoelectric layer 4. The temperature compensation layers 20 can also be arranged between the piezoelectric layer 4 and one or both electrodes 2, 3.

The invention claimed is:

1. An electroacoustic transducer comprising a single piezoelectric layer, which is structured in such a way that, when an alternating electric field is applied in one spatial direction during operation, a three-dimensional oscillation mode with oscillations in three spatial directions is excited, wherein the three-dimensional oscillation mode has one oscillation component in a direction along the alternating electrical field and two oscillation components in two further spatial directions such that the piezoelectric layer oscillates in three spatial directions at the same time.

2. The electroacoustic transducer according to claim 1, wherein the piezoelectric layer comprises a planar layer that is structured with holes and/or slots.

3. The electroacoustic transducer according to claim 1, wherein the electroacoustic transducer has a region in which an extent of the piezoelectric layer in the direction in which a speed of sound in the piezoelectric layer is highest is at least of just the same magnitude as an extent of the piezoelectric layer in the other spatial directions.

4. The electroacoustic transducer according to claim 3, wherein the extent of the piezoelectric layer in the direction in which the speed of sound in the piezoelectric layer is highest is chosen such that the electroacoustic transducer is operated in a fundamental mode.

5. The electroacoustic transducer according to claim 1, wherein the electroacoustic transducer further comprises a first electrode and a second electrode, wherein a top side of the piezoelectric layer is connected to the first electrode and an underside of the piezoelectric layer is connected to the second electrode.

6. The electroacoustic transducer according to claim 1, wherein the piezoelectric layer comprises a plurality of blocks comprising a piezoelectric material, and wherein an extent of each block in the direction in which a speed of sound in the piezoelectric layer is highest is at least of just the same magnitude as an extent of the respective block in the other spatial directions.

7. The electroacoustic transducer according to claim 6, wherein the electroacoustic transducer further comprises a first electrode and a second electrode,
wherein a first side of the piezoelectric layer is connected to the first electrode and a second side of the piezoelectric layer is connected to the second electrode,
wherein the first electrode comprises a first electrode structure and a second electrode structure, and
wherein each of the blocks is connected either to the first electrode structure or to the second electrode structure.

8. The electroacoustic transducer according to claim 6, further comprising a connection structure arranged between two of the blocks, the connection structure connecting the two blocks to one another in a lateral direction.

9. The electroacoustic transducer according to claim 8, wherein the connection structure comprises a dielectric material.

10. The electroacoustic transducer according to claim 1, wherein a region of the piezoelectric layer is covered by a cladding layer having an anomalous thermomechanical behavior, and/or passivating properties.

11. The electroacoustic transducer according to claim 1, wherein the piezoelectric layer has cutouts filled with a material having an abnormal thermomechanical behavior and/or a lower stiffness than the piezoelectric layer.

12. The electroacoustic transducer according to claim 1, wherein the piezoelectric layer is arranged on an acoustic mirror.

13. The electroacoustic transducer according to claim 1, wherein the piezoelectric layer is arranged in a freely oscillating fashion.

14. The electroacoustic transducer according to claim 1, wherein the piezoelectric layer forms a phononic bandgap structure.

15. The electroacoustic transducer according to claim 1, wherein the piezoelectric layer comprises a first partial layer comprising a piezoelectric material and a second partial layer comprising a piezoelectric material, and wherein the electroacoustic transducer comprises an intermediate layer arranged between the first partial layer and the second partial layer.

16. The electroacoustic transducer according to claim 1, wherein the piezoelectric layer comprises a crystal structure selected from the group of structures consisting of crystal classes 1, 3, m, 3m, $\bar{6}$, 32, 2, mm2, 4, $\bar{4}$, 4mm, 222, 23, $\bar{4}$3m, 6 and 6mm.

17. The electroacoustic transducer according to claim 1, wherein the excited oscillation mode comprises a longitudinal oscillation, a shear oscillation or a combination of the two.

18. The electroacoustic transducer according to claim 1, wherein the piezoelectric layer comprises crystallites whose crystal axis is aligned predominantly parallel.

19. The electroacoustic transducer according to claim 1, wherein the piezoelectric layer is quasi epitaxial or epitaxial.

20. An electroacoustic transducer comprising:
a piezoelectric layer, which is structured in such a way that, when an alternating electric field is applied in one spatial direction during operation, a three-dimensional oscillation mode with oscillations in three spatial directions is excited, wherein the three-dimensional oscillation mode has one oscillation component in a direction along the alternating electrical field and two oscillation components in two further spatial directions, wherein the piezoelectric layer comprises a plurality of blocks comprising a piezoelectric material, wherein an extent of each block in the direction in which a speed of sound in the piezoelectric layer is highest is at least of just the same magnitude as an extent of the respective block in the other spatial directions; and
a first electrode and a second electrode, wherein a first side of the piezoelectric layer is connected to the first electrode and a second side of the piezoelectric layer is connected to the second electrode, wherein the first electrode comprises a first electrode structure and a second electrode structure, wherein each of the blocks is connected either to the first electrode structure or to the second electrode structure, and wherein the blocks and the first and second electrode structures are arranged in such a way that two adjacent blocks are connected to different electrode structures.

* * * * *